United States Patent
Imamura et al.

(10) Patent No.: US 11,072,672 B2
(45) Date of Patent: Jul. 27, 2021

(54) PROCESS FOR PRODUCING MODIFIED MOLDED ARTICLE, MOLDED ARTICLE, DIAPHRAGM, AND DIAPHRAGM VALVE

(71) Applicant: DAIKIN INDUSTRIES, LTD., Osaka (JP)

(72) Inventors: Hitoshi Imamura, Osaka (JP); Tatsuya Funaoka, Osaka (JP); Takeshi Shimono, Osaka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 113 days.

(21) Appl. No.: 16/329,059

(22) PCT Filed: Aug. 1, 2017

(86) PCT No.: PCT/JP2017/027855
§ 371 (c)(1),
(2) Date: Feb. 27, 2019

(87) PCT Pub. No.: WO2018/043003
PCT Pub. Date: Mar. 8, 2018

(65) Prior Publication Data
US 2019/0218320 A1  Jul. 18, 2019

(30) Foreign Application Priority Data

Aug. 30, 2016  (JP) .............................. JP2016-168249

(51) Int. Cl.
*C08F 214/26* (2006.01)
*F16K 7/12* (2006.01)
*F16K 7/14* (2006.01)
*C08J 7/00* (2006.01)
*B29C 35/08* (2006.01)
*C08J 7/12* (2006.01)
*F16K 25/00* (2006.01)
*B29K 27/18* (2006.01)
*B29L 31/00* (2006.01)
*H01L 21/67* (2006.01)

(52) U.S. Cl.
CPC ...... *C08F 214/262* (2013.01); *B29C 35/0805* (2013.01); *B29C 35/0866* (2013.01); *C08J 7/00* (2013.01); *C08J 7/123* (2013.01); *F16K 7/12* (2013.01); *F16K 7/14* (2013.01); *F16K 25/005* (2013.01); *B29C 2035/0877* (2013.01); *B29K 2027/18* (2013.01); *B29L 2031/7506* (2013.01); *C08F 2800/20* (2013.01); *H01L 21/67017* (2013.01)

(58) Field of Classification Search
CPC ............ B29C 35/0805; B29C 35/0866; B29C 2035/0877; B29C 2035/0883; B29C 2035/0827; B29C 2035/0844; B29C 2035/085; B29C 71/04; C08F 214/262; C08F 2800/20; C08J 7/00; C08J 2327/18; B29K 2027/18; G29L 2031/7506

See application file for complete search history.

(56) References Cited

U.S. PATENT DOCUMENTS

| | | | |
|---|---|---|---|
| 3,142,665 A * | 7/1964 | Cardinal | C08F 2/38 428/402 |
| 3,819,594 A * | 6/1974 | Holmes et al. | C08F 214/262 526/247 |
| 5,709,944 A | 1/1998 | Kokumai et al. | |
| 5,763,082 A | 6/1998 | Kokumai et al. | |
| 5,985,949 A | 11/1999 | Seguchi et al. | |
| 10,731,015 B2 * | 8/2020 | Sawaki et al. | C08J 7/123 |
| 2003/0008935 A1 | 1/2003 | Yamamoto et al. | |
| 2013/0119290 A1 | 5/2013 | Takeda et al. | |
| 2014/0107250 A1 | 4/2014 | Maeda et al. | |
| 2015/0158988 A1 | 6/2015 | Sawaki et al. | |

FOREIGN PATENT DOCUMENTS

| | | |
|---|---|---|
| EP | 0 301 543 A2 | 2/1989 |
| JP | 61-215050 A | 9/1986 |
| JP | 64-033810 A | 2/1989 |
| JP | 09-278907 A | 10/1997 |
| JP | 10-316761 A | 12/1998 |
| JP | 11-037329 A | 2/1999 |
| JP | 11-080392 A | 3/1999 |
| JP | 2000-159914 A | 6/2000 |
| JP | 3177983 B2 | 6/2001 |
| JP | 2012-026476 A | 2/2012 |
| JP | 2013-027875 A | 2/2013 |
| JP | 2014-028951 A | 2/2014 |
| JP | 2014-044401 A | 3/2014 |
| WO | 2012/081293 A1 | 6/2012 |

OTHER PUBLICATIONS

International Search Report of PCT/JP2017/027855 dated Oct. 31, 2017.
International Preliminary Report on Patentability with Translation of Written Opinion of the International Searching Authority dated Mar. 5, 2019 for PCT/JP2017/027855.

* cited by examiner

*Primary Examiner* — Sanza L. McClendon
(74) *Attorney, Agent, or Firm* — Sughrue Mion, PLLC

(57) ABSTRACT

The invention provides a process for producing a modified molded article capable of providing a diaphragm that is less likely to generate particles. The process for producing a modified molded article includes: molding modified polytetrafluoroethylene containing a tetrafluoroethylene unit and a modifying monomer unit based on a modifying monomer copolymerizable with tetrafluoroethylene to provide a molded article; and irradiating the molded article with not lower than 30 kGy but lower than 70 kGy of radiation at 270° C. to 310° C. to provide a modified molded article.

14 Claims, 1 Drawing Sheet

PROCESS FOR PRODUCING MODIFIED MOLDED ARTICLE, MOLDED ARTICLE, DIAPHRAGM, AND DIAPHRAGM VALVE

CROSS REFERENCE TO RELATED APPLICATIONS

This application is a National Stage of International Application No. PCT/JP2017/027855 filed Aug. 1, 2017, claiming priority based on Japanese Patent Application No. 2016-168249 filed Aug. 30, 2016.

TECHNICAL FIELD

The invention relates to processes for producing modified molded articles, molded articles, diaphragms, and diaphragm valves.

BACKGROUND ART

Diaphragm valves are used in semiconductor manufacturing plants for supply of highly corrosive chemicals used in semiconductor manufacturing. The diaphragm valves are formed of materials such as polytetrafluoroethylene (PTFE) and tetrafluoroethylene/perfluoro alkyl vinyl ether copolymers (PFAs) because these materials have excellent properties such as chemical resistance and non-stickiness. Unfortunately, diaphragm valves generate particles, causing issues such as reduction in yield of semiconductor manufacturing.

Patent Literature 1 discloses a conventional diaphragm valve whose valve body is formed from PTFE. This valve body is shaped by cutting, so that foreign substances such as burrs attach to the valve body and inevitably generate particles. The document also discloses that forming at least the valve body from a PFA molded article can prevent attachment of foreign substances such as burrs due to cutting and the resulting generation of particles.

Patent Literature 2 discloses that with a diaphragm and a valve seat having different hardnesses, the member having a lower hardness is likely to be shaved off when the diaphragm is pressed to the valve seat. The document also discloses that providing a substantially equal hardness to the diaphragm and the valve seat can reduce generation of particles in the diaphragm valve. One example thereof disclosed in the document is to form the diaphragm from modified PTFE and form the valve seat from PFA.

CITATION LIST

Patent Literature

Patent Literature 1: JP H11-37329 A
Patent Literature 2: JP 2012-26476 A
Patent Literature 3: JP H01-33810 A
Patent Literature 4: JP H10-316761 A
Patent Literature 5: JP 2000-159914 A
Patent Literature 6: JP 2013-27875 A
Patent Literature 7: JP 2014-44401 A
Patent Literature 8: JP H09-278907 A

SUMMARY OF INVENTION

Technical Problem

Miniaturization of semiconductor circuits creates a demand for techniques of further reducing particles.

In view of the above current state of the art, the invention aims to provide a process for producing a modified molded article capable of achieving a diaphragm that is less likely to generate particles.

The invention also aims to provide a molded article, a diaphragm, and a diaphragm valve which are less likely to generate particles.

Solution to Problem

The inventors examined solutions to the above issues, and found that a diaphragm formed from modified polytetrafluoroethylene (modified PTFE) is more greatly worn and generate more particles than a valve seat formed from a tetrafluoroethylene/perfluoro alkyl vinyl ether copolymer (PFA) even though they have similar hardness. The inventors further performed studies to find that a modified molded article obtainable by treating modified PTFE with radiation under specific conditions is less likely to generate particles even when repeatedly brought into contact with and released from a PFA molded article. Finally, the inventors completed the invention.

As is disclosed in Patent Literature documents 3 to 8, known techniques are present which modify PTFE and PFA by irradiation. Still, the inventors found that the irradiation needs to be performed under conditions different from conventional ones so as to provide a modified molded article of modified PTFE that is less likely to generate particles.

In other words, the invention relates to a process for producing a modified molded article, including: molding modified polytetrafluoroethylene containing a tetrafluoroethylene unit and a modifying monomer unit based on a modifying monomer copolymerizable with tetrafluoroethylene to provide a molded article; and irradiating the molded article with not lower than 30 kGy but lower than 70 kGy of radiation at 270° C. to 310° C. to provide a modified molded article.

The modified polytetrafluoroethylene preferably contains 0.001 to 1% by mass of the modifying monomer unit relative to a sum of amounts of the tetrafluoroethylene unit and the modifying monomer unit.

The modified polytetrafluoroethylene preferably has a secondary melting point of 320° C. to 329° C.

The production process preferably further includes machining the molded article after the molded article is provided.

The production process preferably further includes machining the modified molded article after the modified molded article is provided.

The modified molded article is preferably a diaphragm.

The invention also relates to a molded article containing modified polytetrafluoroethylene, the modified polytetrafluoroethylene containing a tetrafluoroethylene unit, a modifying monomer unit based on a modifying monomer copolymerizable with tetrafluoroethylene, and tertiary carbon, the tertiary carbon being present in an amount of 0.035 to 0.100 mol % relative to a sum of amounts of the tetrafluoroethylene unit and the modifying monomer unit.

The modified polytetrafluoroethylene preferably contains 0.001 to 1% by mass of the modifying monomer unit relative to the sum of the amounts of the tetrafluoroethylene unit and the modifying monomer unit.

The invention also relates to a diaphragm including the above molded article.

The invention also relates to a diaphragm obtainable by irradiating modified polytetrafluoroethylene with not lower than 30 kGy but lower than 70 kGy of radiation at 270° C. to 310° C.

The invention also relates to a diaphragm valve including a valve seat and the above diaphragm. The valve seat preferably contains a tetrafluoroethylene/perfluoro alkyl vinyl ether copolymer.

Advantageous Effects of Invention

The production process of the invention can provide a modified molded article capable of providing a diaphragm that is less likely to generate particles.

The molded article of the invention is less likely to generate particles.

The diaphragm and the diaphragm valve of the invention are less likely to generate particles.

DESCRIPTION OF EMBODIMENTS

Figure 1:
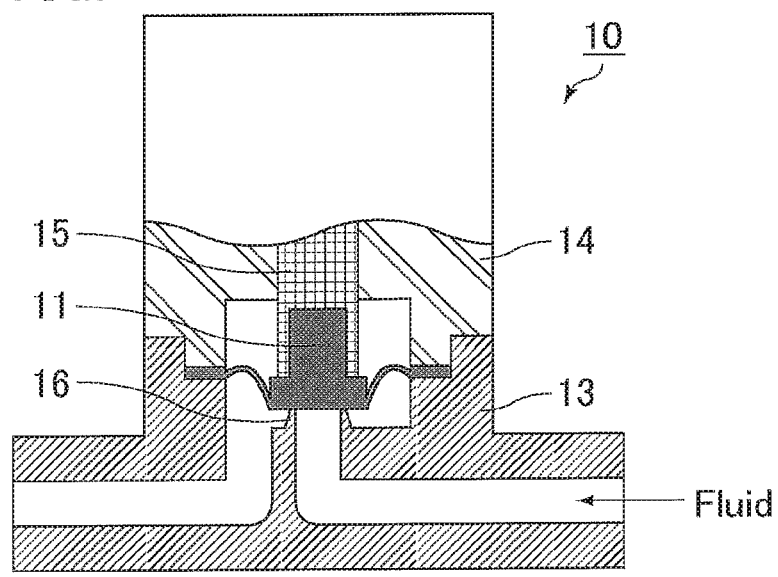
FIG. 1 is a schematic cross-sectional view of a diaphragm and a diaphragm valve of an embodiment of the invention.

The invention will be specifically described hereinbelow.

The production process of the invention includes molding modified polytetrafluoroethylene (modified PTFE) to provide a molded article. In the present description, this step is also referred to a molding step.

The molding may be performed by a known method for molding the modified PTFE. Examples thereof include compression molding, ram extrusion molding, and isostatic pressing. Another method may be mentioned in which an aqueous dispersion of the modified PTFE is applied, and then dried and baked. Still, this method is not preferred in the invention because the method has difficulty in producing a molded article which needs to have bending resistance, such as a diaphragm.

The molding method is preferably compression molding. In other words, the molding step preferably includes filling powder of the modified PTFE into a mold and compressing it to provide a pre-molded article (preform) and heating the pre-molded article up to a temperature that is equal to or higher than the primary melting point of the modified PTFE to provide the molded article.

Examples of the shape of the molded article include, but are not limited to, a film, a sheet, a plate, a rod, a block, a cylinder, a container, a tube, a bellows, a packing, and a gasket. The molded article may be a molded article (also referred to as a block) obtained by compression molding. The material may be molded into the shape of a diaphragm, thereby providing a molded article in the shape of a diaphragm.

The production process also preferably includes machining the molded article into a predetermined shape after the molded article is provided in the molding step. The modified PTFE has a very high melt viscosity even when heated up to a temperature that is equal to or higher than the melting point, and thus cannot be subjected to extrusion molding or injection molding, which are used for common thermoplastic resins. This makes it difficult to obtain a molded article having a complicated and fine shape, such as a diaphragm, directly from the modified PTFE powder. On the contrary, machining the molded article prepared in advance can easily provide a molded article having a complicated and fine shape.

The machining may be cutting. For example, a block of the modified PTFE obtained may be subjected to cutting so that a film is cut out of the block, and this film may be cut into a predetermined shape.

In this processing, the molded article is also preferably processed into the shape of a diaphragm by the machining, preferably the cutting.

The modified PTFE contains a tetrafluoroethylene (TFE) unit and a modifying monomer unit based on a modifying monomer copolymerizable with TFE. The modified PTFE advantageously has excellent creep resistance in comparison with homo PTFE consisting only of a TFE unit. Thus, the production process can provide a modified molded article suitably used for a diaphragm.

In the modified PTFE, the amount of the modifying monomer unit is 0.001 to 1% by mass, more preferably 0.01 to 1% by mass, still more preferably 0.02 to 0.20% by mass, relative to the sum of the TFE unit and the modifying monomer unit. Too small an amount thereof causes poor creep resistance. Too large an amount thereof causes a low tensile strength and poor crack resistance. Further, even if a large amount of expensive perfluorovinyl ether is used, an effect of improving the creep resistance is insufficient, resulting in poor economic efficiency. The modifying monomer unit as used herein means a moiety of the molecular structure of modified PTFE and is a moiety derived from a modifying monomer. The amount of the modifying monomer unit can be determined by Fourier transform infrared spectroscopy (FT-IR) as disclosed in JP 3177983 B.

The modified PTFE has non-melt-processibility. The "non-melt-processibility" means that the melt flow rate cannot be determined at a temperature that is higher than the crystal melting point in accordance with ASTM D-1238 and D-2116.

The modified PTFE preferably has a standard specific gravity (SSG) of 2.13 to 2.23, more preferably 2.13 to 2.19. The SSG is the SSG standardized in ASTM D4895-89 as an indicator of the molecular weight of non melt-processible PTFE.

The modified PTFE preferably has a primary melting point of 332° C. to 348° C. The primary melting point is a value determined by differential scanning calorimetry (DSC) at a temperature-increasing rate of 10° C./min for the modified PTFE that has never been heated up to 300° C. or higher.

The modified PTFE preferably has a secondary melting point of 320° C. to 329° C. The secondary melting point is a value determined by differential scanning calorimetry (DSC) at a temperature-increasing rate of 10° C./min for the modified PTFE heated up to a temperature (e.g., 360° C.) that is equal to or higher than the primary melting point.

The modifying monomer may be any monomer copolymerizable with TFE. Examples thereof include perfluoroolefins such as hexafluoropropylene (HFP); chlorofluoroolefins such as chlorotrifluoroethylene (CTFE); hydrogen-containing fluoroolefins such as trifluoroethylene and vinylidene fluoride (VDF); perfluorovinyl ether; perfluoroalkyl ethylene; and ethylene. One modifying monomer may be used or a plurality thereof may be used.

Examples of the perfluorovinyl ether include, but are not limited to, unsaturated perfluoro compounds represented by the following formula (1):

$$CF_2=CF-ORf \quad (1)$$

wherein Rf is a perfluoro organic group. The term "perfluoro organic group" as used herein means an organic group in which all hydrogen atoms binding to any carbon atom are replaced by fluorine atoms. The perfluoro organic group may contain ether oxygen.

The perfluorovinyl ether may be perfluoro(alkyl vinyl ether) (PAVE) in which Rf is a C1-C10 perfluoroalkyl group in the formula (1). The perfluoroalkyl group preferably contains 1 to 5 carbon atoms.

Examples of the perfluoroalkyl group in the PAVE include a perfluoromethyl group, a perfluoroethyl group, a perfluoropropyl group, a perfluorobutyl group, a perfluoropentyl group, and a perfluorohexyl group. Preferred is perfluoro (propyl vinyl ether) (PPVE) in which the perfluoroalkyl group is a perfluoropropyl group.

Examples of the perfluorovinyl ether further include those in which Rf is a C4-C9 perfluoro(alkoxyalkyl) group in the formula (1); those in which Rf is a group represented by the following formula:

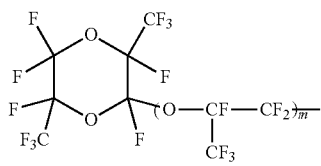
[Chem. 1]

wherein m is 0 or an integer of 1 to 4; and those in which Rf is represented by the following formula:

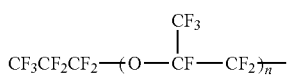
[Chem. 2]

wherein n is an integer of 1 to 4.

Examples of the perfluoroalkyl ethylene include, but are not limited to, (perfluorobutyl)ethylene (PFBE) and (perfluorohexyl)ethylene.

The modifying monomer in the modified PTFE is preferably at least one selected from the group consisting of HFP, CTFE, VDF, PAVE, PFBE, and ethylene, more preferably PAVE, still more preferably PPVE.

The production process of the invention further includes irradiating the molded article with not lower than 30 kGy but lower than 70 kGy of radiation at 270° C. to 310° C. to provide a modified molded article.

What the inventors found is that irradiation even at a temperature lower than the secondary melting point of the modified PTFE can provide a modifying effect. Irradiation at a temperature lower than 270° C. causes a deterioration of the molded article, causing embrittlement and insufficient mechanical strength. Irradiation at a temperature higher than 310° C., which is closer to the melting point, causes deformation of the molded article. The irradiation temperature is preferably 280° C. or higher and 300° C. or lower.

The irradiation temperature can be adjusted by any known method. Specific examples thereof include a method of holding the modified PTFE in a heating furnace maintained at a predetermined temperature, and a method of placing the modified PTFE on an electric griddle and heating the electric griddle by supplying electricity to a built-in heater or with an external heating device.

The exposure of the radiation is preferably 60 kGy or lower and 40 kGy or higher.

The production process of the invention is also characterized by the irradiation conditions with a relatively low temperature and a relatively low exposure. Thus, the irradiation hardly damages the molded article or changes the dimensions of the molded article. Accordingly, even when the molded article is a molded article having a complicated and fine shape, such as a diaphragm, the irradiation neither deforms the shape nor impairs the mechanical properties.

Owing to the above feature, the production process of the invention can be applied to a molded article having a small thickness and a molded article having a complicated and fine shape. Irradiation causes cleavage of the main chain of a polymer and crosslinking of polymer molecules. Under conventional irradiation conditions, the irradiation temperature is high and crosslinking of polymer molecules preferentially progresses, so that even radiation at a high exposure causes a small influence due to cleavage of the polymer main chain. In contrast, a high irradiation temperature is likely to change the dimensions of the molded article, and thus is difficult to apply particularly to a molded article having a small thickness and a molded article having a complicated and fine shape. A low irradiation temperature is less likely to provide a modifying effect by the irradiation and causes a great influence due to cleavage of the polymer main chain, causing embrittlement of the resulting molded article in some cases. The inventors performed studies to find, as described above, that the irradiation temperature and the exposure each falling within the very limited range can lead to production of a modified molded article that is less likely to generate particles even when the molded article has a small thickness or has a complicated and fine shape.

The molded article may have a thickness of 3.0 mm or smaller, 2.5 mm or smaller, 2.0 mm or smaller, 1.5 mm or smaller, or 1.0 mm or smaller. The lower limit of the thickness may be, but is not limited to, 0.1 mm in consideration of bending resistance.

Part of the molded article alone may be irradiated with radiation. For the molded article in the shape of a diaphragm, part to be in contact with the valve seat alone may be irradiated with radiation.

Examples of the radiation include an electron beam, ultraviolet rays, gamma rays, X-rays, a neutron beam, and a high-energy ion. Preferred among these is an electron beam because it has excellent penetrability and a high dose rate so that it is suitable for industrial production.

The irradiation may be performed by, but not limited to, a method using a conventionally known irradiation device.

For the irradiation environment, the oxygen concentration is preferably 1000 ppm or less, the absence of oxygen is more preferred, irradiation in vacuo or in an inert gas atmosphere such as nitrogen, helium, or argon is still more preferred, although not limited thereto.

The modified PTFE that is a material of the modified molded article preferably has an MIT value of seven million times or more, more preferably 10 million times or more.

The MIT value can be determined in conformity with ASTM D2176. Specifically, a test piece having a width of 12.5 mm, a length of 130 mm, and a thickness of 0.25 mm is prepared and mounted on an MIT type tester (No. 12176, Yasuda Seiki Seisakusho, Ltd.). The test piece is folded at a load of 1.25 kg, left and right folding angles of 135 degrees, and a folding rate of 175 times/min. The MIT value is the number of folding processes until the test piece fractures.

The production process of the invention may further include machining the modified molded article into a predetermined shape after the modified molded article is provided. The machining is the same as mentioned above. Still, because the irradiation conditions in the production process of the invention can also be applied to a molded article having a small thickness and a molded article having a complicated and fine shape, it is highly convenient to machine the molded article into a predetermined shape before irradiation.

The aforementioned production process can provide a modified molded article. A modified molded article obtainable by the production process is useful because it is less likely to generate particles. The modified molded article may be a diaphragm.

The invention also relates to a molded article containing modified PTFE, the modified PTFE containing a TFE unit, a modifying monomer unit based on a modifying monomer copolymerizable with TFE, and tertiary carbon, the tertiary carbon being present in an amount of 0.035 to 0.100 mol % relative to the sum of the TFE unit and the modifying monomer unit. This molded article is formed from the modified PTFE containing the specific amount of the tertiary carbon, and thus is less likely to generate particles and has good mechanical properties.

The amount of the tertiary carbon can be determined by performing $^{19}$F-NMR analysis on the molded article to obtain the following peak intensities A to C (peak integral values), and substituting these peak intensities into the following formula.

$^{19}$F-NMR Analysis Conditions

Analysis device: solid state $^{19}$F-NMR system, Bruker Corp.

Analysis conditions: 282 MHz ($CF_2$ of modified PTFE is set to −120 ppm), spinning rate 30 kHz Peak Intensity A The intensity of the peak observed at a chemical shift of −80 (−74 to −85) ppm and assigned to five C—F* bonds in —O—$CF^*_2$— and —$CF^*_3$ of perfluoroalkyl vinyl ether (PAVE) which is a modifying monomer Peak Intensity B The intensity of the peak observed at a chemical shift of −120 (−84 to −150) ppm, where five C—F* bonds in PAVE and four C—F* bonds derived from tetrafluoroethylene (TFE) overlap each other Peak Intensity C The intensity of the peak of F* observed at a chemical shift of −183 (−178 to −191) ppm and assigned to tertiary carbon —$CF_2$$CF^*$ (—$CF_2$—)$CF_2$—

Amount of tertiary carbon (mol %)=100×(peak intensity C)/{(peak intensity A/5)+[peak intensity B−peak intensity A]/4+(peak intensity C)}   Formula For the modifying monomer which is a monomer other than PAVE, the amount of the tertiary carbon can be determined by $^{19}$F-NMR analysis.

The modified PTFE containing the tertiary carbon may have the same structure as the modified PTFE used in the aforementioned process for producing a modified molded article, except for the presence of the tertiary carbon.

The modified PTFE containing the tertiary carbon can be produced by irradiating the modified PTFE with not lower than 30 kGy but lower than 70 kGy of radiation at 270° C. to 310° C. In other words, in a preferred aspect of the invention, the molded article that contains the modified PTFE containing the tertiary carbon is the aforementioned modified-molded article. The irradiation temperature is preferably 280° C. or higher and 300° C. or lower. The exposure of the radiation is preferably 60 kGy or lower and 40 kGy or higher.

The molded article that contains the modified PTFE containing the tertiary carbon may have a thickness of 3.0 mm or smaller, 2.5 mm or smaller, 2.0 mm or smaller, 1.5 mm or smaller, or 1.0 mm or smaller. The lower limit of the thickness may be, but is not limited to, 0.1 mm in consideration of bending resistance.

The invention also relates to a diaphragm including the aforementioned molded article. Because the diaphragm includes the modified PTFE containing the specific amount of the tertiary carbon, it is less likely to be deteriorated even when brought into contact with substances such as a highly corrosive chemical used in semiconductor plants, and is less likely to generate particles even when repeatedly brought into contact with a valve seat.

The invention also relates to a diaphragm obtainable by irradiating the modified PTFE with not lower than 30 kGy but lower than 70 kGy of radiation at 270° C. to 310° C. The modified PTFE before the irradiation has the same structure as the modified PTFE used in the process for producing a modified molded article. Because the diaphragm includes the modified PTFE irradiated with not lower than 30 kGy but lower than 70 kGy of radiation at 270° C. to 310° C., it has good mechanical properties, is less likely to be deteriorated even when brought into contact with substances such as a highly corrosive chemical used in semiconductor plants, and is less likely to generate particles even when repeatedly brought into contact with a valve seat.

Part of the diaphragm alone may be irradiated with the radiation. The diaphragm is not limited to those obtainable by irradiating the whole modified PTFE with the radiation.

The irradiation temperature is preferably 280° C. or higher and 300° C. or lower.

The exposure of the radiation is preferably 60 kGy or lower and 40 kGy or higher.

The diaphragm may have a thickness of 3.0 mm or smaller, 2.5 mm or smaller, 2.0 mm or smaller, 1.5 mm or smaller, or 1.0 mm or smaller. The lower limit of the thickness may be, but is not limited to, 0.1 mm in consideration of bending resistance. The thickness of the diaphragm may be the thickness of the thinnest part of the diaphragm.

The diaphragm preferably has a melting point of 320° C. to 329° C. The melting point is a value determined for the diaphragm by differential scanning calorimetry (DSC) at a temperature-increasing rate of 10° C./min.

The invention also relates to a diaphragm valve including a valve seat and the aforementioned diaphragm. The diaphragm valve having the above feature can be used for supply of substances such as a highly corrosive chemical used in semiconductor manufacturing, and is less likely to generate particles even when used for a long period of time. The diaphragm valve preferably includes a valve seat provided on the valve body and the diaphragm to be brought into contact with and separated from the valve seat.

FIG. 1 is a schematic cross-sectional view of a diaphragm and a diaphragm valve of an embodiment of the invention. A diaphragm valve 10 shown in FIG. 1 is closed. As shown in FIG. 1, a body (valve body) 13 is coupled with a cylinder 14. The diaphragm valve 10 is provided with a diaphragm 11. The fringe portion of the diaphragm 11 is sandwiched between the body 13 and the cylinder 14 so that the diaphragm 11 is fixed therebetween. The diaphragm 11 is coupled with a piston rod 15. The up-and-down motion of the piston rod 15 moves the diaphragm 11 up and down.

The body 13 is provided with a valve seat 16. When the diaphragm 11 is brought into contact with the valve seat 16, a fluid stream is blocked, while when the diaphragm 11 is separated from the valve seat 16, the fluid is supplied. As described above, the diaphragm valve 10 controls the amount of fluid stream by bringing the diaphragm 11 into contact with the valve seat 16 and separating them. Because the diaphragm 11 is a diaphragm having the aforementioned structure, it is less likely to generate particles even though contact and separation are repeated.

The body 13 integrally formed with the valve seat 16 may be formed from a material such as metal or resin. Examples of the resin include PTFE, a tetrafluoroethylene/perfluoro alkyl vinyl ether copolymer (PFA), and polyphenylene sulfide (PPS). In order to achieve easy molding and excellent chemical resistance, PFA is preferred. The diaphragm of the invention is less likely to generate particles even when repeatedly brought into contact with and separated from the valve seat formed from PFA. The PFA preferably has melt-fabricability.

Example

The invention is described below with reference to experimental examples. Still, the invention is not intended to be limited by these experimental examples.

The parameters in the experimental examples were determined by the following methods.
(Secondary Melting Point of Modified PTFE)

The secondary melting point of the modified PTFE was defined as the temperature corresponding to the maximum value on a heat-of-fusion curve obtained using a differential scanning calorimeter (DSC) with a temperature-increasing rate of 10° C./min.
(Amount of Modifying Monomer Unit)

The amount of the modifying monomer unit is determined from the characteristic absorption (e.g., 1040 cm$^{-1}$ to 890 cm$^{-1}$ for perfluoro(propyl vinyl ether) (PPVE)) by infrared spectroscopy.
(MIT Value)

The MIT value was determined in conformity with ASTM D2176. Specifically, a test piece having a width of 12.5 mm, a length of 130 mm, and a thickness of 0.25 mm and not irradiated with radiation was prepared and mounted on an MIT type tester (No. 12176, Yasuda Seiki Seisakusho, Ltd.). The test piece was folded at a load of 1.25 kg, left and right folding angles of 135 degrees, and a folding rate of 175 times/min. The number of folding processes until the test piece fractures (MIT value) was counted.

Experimental Example 1

Modified PTFE powder (containing 0.06% by mass of a PPVE unit relative to the sum of a TFE unit and the PPVE unit and having a secondary melting point of 323° C.) was obtained in the same manner as in Example 1 of JP 3177983 B. Then, 200 g of the powder was filled into a mold having a diameter of 50 mm and a height of 50 mm. The powder was pressed from both sides at 15 MPa and the pressure was maintained for 30 minutes. Thereby, a pre-molded article was obtained. This pre-molded article was heated at a temperature-increasing rate of 90° C./h, maintained at 360° C. for four hours, and then cooled at 40° C./h. Thereby, a molded article block was obtained. This block was cut, so that a 0.5-mm-thick sheet and a 0.25-mm-thick sheet were produced. The 0.25-mm-thick sheet had an MIT value of 15 million times.

The 0.5-mm-thick sheet was cut into a test piece having a width of 30 mm and a length of 220 mm.

The resulting test piece was placed in an electron beam irradiation container of an electron beam irradiation device (NHV Corp.). Nitrogen gas was introduced into the container so that the inside of the container was in a nitrogen atmosphere. The temperature inside the container was increased up to 280° C. and stabilized. Then, the test piece was irradiated with 40 kGy of an electron beam at an electron beam accelerating voltage of 3000 kV and an exposure intensity of 20 kGy/5 min. The test piece showed a dimensional change of 1% or less before and after the electron beam irradiation, and showed no creases.

Other Experimental Examples

A 0.5-mm-thick sheet was obtained in the same manner as in Experimental Example 1, except that the irradiation temperature and the exposure shown in Table 1 or 2 were used.
(Particle Generation Testing)

Figure 2:
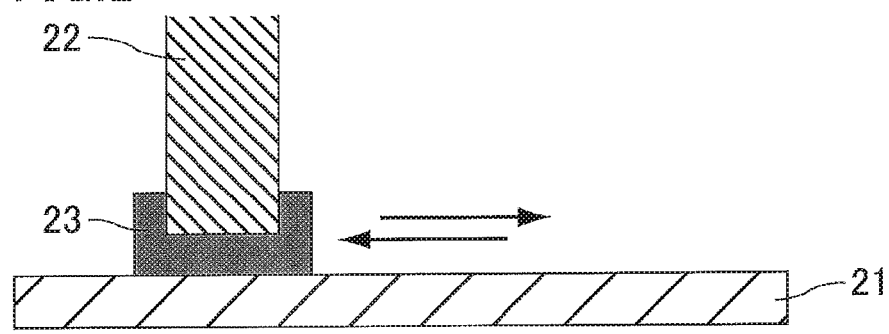
FIG. 2 is a schematic diagram illustrating a method of particle generation testing.
Figure 3:
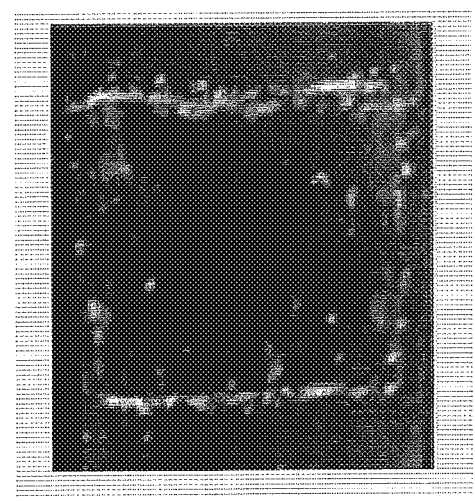
FIG. 3 is a photograph of a PFA sheet after the particle generation testing performed in Experimental Example 1. The photograph shows that deposits attach on the PFA sheet.

The 0.5-mm-thick sheet was used for the testing. A PFA sheet 23 fixed on a tip of a friction block 22 was placed on a sheet 21 and they are reciprocatively rubbed using a color fastness rubbing tester (Yasuda Seiki Seisakusho Ltd.), as shown in FIG. 2. The load was 500 g and the number of rubbing was 2000 times (30 times/min). The PFA sheet was released from the friction block, and the amount of deposits (powder) on the PFA sheet was measured. The results are shown in Tables 1 and 2.

In Experimental Examples 5 and 8, the sample fractured during the testing and thus the testing was not completed. The results in Experimental Examples 5 and 8 demonstrate that too high an exposure of the radiation caused a failure in providing mechanical properties that diaphragms usually need to have.
(Analysis of Deposits)

The composition of the deposits on the PFA sheet obtained in Experimental Example 2 was identified by the following method. The PFA sheet carrying the deposits was placed on a hot stage and heated up to a temperature that is not lower than 305° C., the melting point of PFA, but lower than 323° C., the melting point of the modified PTFE. Observation using a polarization microscope (BX51, Olympus Corp.) found that the PFA sheet started to melt but the deposits did not melt. As the workpiece was further heated up to a temperature equal to or higher than the melting point of the modified PTFE, the deposits melted. This demonstrates that the deposits on the PFA sheet were deposits of the modified PTFE.
(Amount of Tertiary Carbon)

The amount of the tertiary carbon was determined by $^{19}$F-NMR analysis on the 0.5-mm-thick sheet. The calculation method is as described above.

TABLE 1

|  | Experimental Example 1 | Experimental Example 2 | Experimental Example 3 | Experimental Example 4 | Experimental Example 5 |
| --- | --- | --- | --- | --- | --- |
| Irradiation temperature (° C.) | Not treated | 280 | 280 | 280 | 280 |
| Exposure (kGy) |  | 20 | 40 | 60 | 120 |
| Amount of tertiary carbon (mol %) | 0 | 0.031 | 0.035 | 0.070 | 0.105 |
| Amount of deposits (g) | 0.0006 | 0.0004 | 0.0002 | 0.0001 | N.D. |

TABLE 2

|  | Experimental Example 6 | Experimental Example 7 | Experimental Example 8 |
| --- | --- | --- | --- |
| Irradiation temperature (° C.) | 300 | 300 | 300 |
| Exposure (kGy) | 40 | 60 | 100 |
| Amount of tertiary carbon (mol %) | 0.088 | 0.096 | 0.110 |
| Amount of deposits (g) | 0.0002 | 0.0001 | N.D. |

REFERENCE SIGNS LIST

10: diaphragm valve
11: diaphragm
13: body
14: cylinder
15: piston rod
16: valve seat
21: sheet (sample)
22: friction block
23: PFA sheet

The invention claimed is:

1. A process for producing a modified molded article, comprising:
    molding modified polytetrafluoroethylene containing a tetrafluoroethylene unit and a modifying monomer unit based on a modifying monomer copolymerizable with tetrafluoroethylene to provide a molded article; and
    irradiating the molded article with not lower than 30 kGy but lower than 70 kGy of radiation at 270° C. to 310° C. to provide a modified molded article,
    wherein the modified polytetrafluoroethylene has non-processability and a standard specific gravity defined in ASTM D4895-89 of 2.13 to 2.23.

2. The production process according to claim 1,
    wherein the modified polytetrafluoroethylene contains 0.001 to 1% by mass of the modifying monomer unit relative to a sum of amounts of the tetrafluoroethylene unit and the modifying monomer unit.

3. The production process according to claim 1,
    wherein the modified polytetrafluoroethylene has a secondary melting point of 320° C. to 329° C.

4. The production process according to claim 1, further comprising
    machining the molded article after the molded article is provided and before irradiation.

5. The production process according to claim 1, further comprising
    machining the modified molded article after the modified molded article is provided.

6. The production process according to claim 1,
    wherein the modified molded article is a diaphragm.

7. A molded article comprising modified polytetrafluoroethylene,
    the modified polytetrafluoroethylene containing a tetrafluoroethylene unit, modifying monomer unit based on a modifying monomer copolymerizable with tetrafluoroethylene,
    wherein the modified polytetrafluoroethylene constituting the molded article contains tertiary carbon, the tertiary carbon being present in an amount of 0.035 to 0.100 mol % relative to a sum of amounts of the tetrafluoroethylene unit and the modifying monomer unit, and
    wherein the modified polytetrafluoroethylene has non-melt-processability and a standard specific gravity defined in ASTM D4895-89 of 2.13 to 2.23.

8. The molded article according to claim 7,
    wherein the modified polytetrafluoroethylene contains 0.001 to 1% by mass of the modifying monomer unit relative to the sum of the amounts of the tetrafluoroethylene unit and the modifying monomer unit.

9. A diaphragm comprising the molded article according to claim 7.

10. A diaphragm obtainable by irradiating modified polytetrafluoroethylene with not lower than 30 kGy but lower than 70 kGy of radiation at 270° C. to 310° C.,
    wherein the modified polytetrafluoroethylene has non-melt-processability and a standard specific gravity defined in ASTM D4895-89 of 2.13 to 2.23.

11. A diaphragm valve comprising a valve seat and the diaphragm according to claim 9.

12. The diaphragm valve according to claim 11,
    wherein the valve seat comprises a tetrafluoroethylene/perfluoro alkyl vinyl ether copolymer.

13. The production process according to claim 1,
    wherein the molded article is irradiated at 280° C. to 310° C. to provide the modified molded article.

14. The production process according to claim 1,
    wherein the molded article is irradiated at 280° C. to 300° C. to provide the modified molded article.

* * * * *